United States Patent
Huang et al.

(10) Patent No.: US 11,721,954 B2
(45) Date of Patent: Aug. 8, 2023

(54) VERTICAL CAVITY SURFACE EMITTING LASER DIODE (VCSEL) HAVING ALGAASP LAYER WITH COMPRESSIVE STRAIN

(71) Applicant: VISUAL PHOTONICS EPITAXY CO., LTD., Taoyuan (TW)

(72) Inventors: Chao-Hsing Huang, Taoyuan (TW); Yu-Chung Chin, Taoyuan (TW); Van-Truong Dai, Taoyuan (TW)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 108 days.

(21) Appl. No.: 16/931,541

(22) Filed: Jul. 17, 2020

(65) Prior Publication Data

US 2021/0021104 A1    Jan. 21, 2021

(30) Foreign Application Priority Data

Jul. 19, 2019   (TW) .................................. 108125675

(51) Int. Cl.
*H01S 5/34*   (2006.01)
*H01S 5/183*   (2006.01)

(52) U.S. Cl.
CPC ........ *H01S 5/3403* (2013.01); *H01S 5/18361* (2013.01)

(58) Field of Classification Search
CPC ................. H01S 5/3403; H01S 5/3201; H01S 5/183–18397
See application file for complete search history.

(56) References Cited

U.S. PATENT DOCUMENTS 5,442,203 A * 8/1995 Adomi ...................... H01S 5/20
                                                            257/97
5,719,894 A * 2/1998 Jewell .................... B82Y 20/00
                                                            372/45.01

(Continued)

FOREIGN PATENT DOCUMENTS

CN          1307367        8/2001
CN         108736316      11/2018

(Continued)

OTHER PUBLICATIONS

Taiwanese Office Action for Taiwanese Patent Application No. 109124273 dated Sep. 17, 2021.

(Continued)

*Primary Examiner* — Sean P Hagan

(57) ABSTRACT

Provided is a vertical cavity surface emitting laser diode (VCSEL) with low compressive strain DBR layer, including a GaAs substrate, a lower DBR layer, a lower spacer layer, an active region, an upper spacer layer and an upper DBR layer. The lower or the upper DBR layer includes multiple low refractive index layers and multiple high refractive index layers. The lower DBR layer, the lower spacer layer, the upper spacer layer or the upper DBR layer contains $Al_xGa_{1-x}As_{1-y}P_y$, where the lattice constant of $Al_xGa_{1-x}As_{1-y}P_y$ is greater than that of the GaAs substrate. This can moderately reduce excessive compressive strain due to lattice mismatch or avoid tensile strain during the epitaxial growth, thereby reducing the chance of deformation and bowing of the VCSEL epitaxial wafer or cracking during manufacturing. Additionally, the VCSEL epitaxial layer can be prevented from generating excessive compressive strain or tensile strain during the epitaxial growth.

19 Claims, 7 Drawing Sheets

(56) References Cited

U.S. PATENT DOCUMENTS

| | | | |
|---|---|---|---|
| 6,597,017 B1 * | 7/2003 | Seko | H01S 5/32341 |
| | | | 438/22 |
| 8,451,706 B2 | 5/2013 | Kondo | |
| 2002/0074631 A1 * | 6/2002 | Sato | H01S 5/18311 |
| | | | 257/676 |
| 2002/0154675 A1 * | 10/2002 | Deng | B82Y 20/00 |
| | | | 372/96 |
| 2005/0020036 A1 | 1/2005 | Sai | |
| 2007/0053396 A1 | 3/2007 | DeVito et al. | |
| 2007/0217457 A1 * | 9/2007 | Stolz | H01S 5/041 |
| | | | 372/43.01 |
| 2007/0235839 A1 | 10/2007 | DeVito et al. | |
| 2007/0280322 A1 | 12/2007 | Sato et al. | |
| 2011/0170568 A1 | 7/2011 | Kondo | |
| 2013/0328101 A1 | 12/2013 | Stauss et al. | |

FOREIGN PATENT DOCUMENTS

| | | | |
|---|---|---|---|
| CN | 109728502 | | 5/2019 |
| CN | 109994582 | | 7/2019 |
| CN | 110190512 A | * | 8/2019 |
| JP | 56-35490 | | 4/1981 |
| JP | 2006-310534 | | 11/2006 |
| JP | 2006310534 A | * | 11/2006 |
| TW | I399865 | | 6/2013 |
| TW | I643337 | | 12/2018 |

OTHER PUBLICATIONS

Chinese Office Action for Chinese Patent Application No. 202010691407.9 dated Jun. 18, 2021.

* cited by examiner

VERTICAL CAVITY SURFACE EMITTING LASER DIODE (VCSEL) HAVING ALGAASP LAYER WITH COMPRESSIVE STRAIN

CROSS-REFERENCE TO RELATED APPLICATION

This application claims priority to Taiwanese Application Serial No. 108125675, filed on Jul. 19, 2019. The entirety of the above-mentioned patent application is hereby incorporated by reference herein and made a part of this specification.

TECHNICAL FIELD

The technical field relates to a vertical cavity surface emitting layer diode (VCSEL), especially a VCSEL in which the DBR layers or spacer layers have moderate compressive strain.

BACKGROUND

A vertical cavity surface emitting layer diode (VCSEL) is a type of semiconductor laser device, which can be used as the light source for 3D sensing, optical communication or other applications.

The VCSEL structure includes a pair of high-reflectivity thin films, commonly known as a distributed Bragg reflector (DBR) layer. There will be a resonant cavity between a pair of DBR layers. The resonant cavity usually includes a spacer layer and an active layer, and the active layer is composed of a barrier layer and a well layer.

The manufacturing method of the DBR layer is: alternately stacking AlGaAs low refractive index layers and AlGaAs or GaAs high refractive index layers above the GaAs substrate to form a structure with high reflectivity.

Due to the lattice mismatch between the AlGaAs and GaAs substrates, during the epitaxial growth process or at room temperature, AlGaAs will generate compressive strain due to its lattice constant being greater than GaAs. In addition, there are generally two ways to improve the reflectivity of a DBR layer to specific wavelengths. One is to increase the number of stacked layers of the DBR layer; however, the number of AlGaAs layers will also increase, that is, excessive compressive strain will accumulate. The other is to expand the difference between the aluminum compositions of each pair of high and low refractive index layers. As such, although it is not necessary to increase the number of stacked layers of the DBR layer, the compressive strain will also increase when the aluminum composition is increased. However, no matter which method is selected, it is easy for the VCSEL epitaxial wafer to accumulate excessive compressive strain, which causes the epitaxial wafer to deform, and it is easy to generate defects or dislocations in the VCSEL epitaxial layer. This will negatively affect the reliability of the VCSEL or the device manufacturing process. For example, after the substrate is polished, its thickness will become thinner, and the rigidity of the epitaxial wafer will be reduced. Therefore, the substrate cannot resist the excessive compressive strain accumulated in the VCSEL epitaxial wafer to cause severe bowing, which increase the difficulty of the subsequent manufacturing process and the risk of wafer breakage.

When the epitaxial wafer is deformed or warped, the pattern of photolithography process on the epitaxial wafer will be shifted or distorted (or defocusing), resulting in affecting the yield of the process. In addition, the bowing epitaxial wafers are more likely to generate additional stress in the subsequent process, and there are risks about reliability. Moreover, if the excessive stress is accumulated in the epitaxial layer of the VCSEL, the epitaxial wafer is easily deformed, and the risk of VCSEL wafer breakage becomes greater.

If the total excessive stress accumulated in the VCSEL epitaxial layer may cause defects or dislocations in the VCSEL epitaxial layer, it is easy to adversely affect the reliability of the VCSEL.

Please refer to US Patent Publication No. US 2007/0235839 A1 "SEMICONDUCTOR DEVICE UTILIZING AlGaAsP" (hereinafter referred to as the 839 patent). The purpose of the 839 patent is to minimize the stress in a large-area semiconductor device. This patent mentions that there are two reasons for stress induced in a semiconductor structure. One is the selected manufacturing process, and the other is the lattice mismatch between materials. In terms of the lattice mismatch, when $Al_xGa_{1-x}As$ bulk material is formed the GaAs substrate, the lattice mismatch between the GaAs and $Al_xGa_{1-x}As$ results in the $Al_xGa_{1-x}As$ bulk material having compressive strain and bowing. The deformation of bulk materials has a problem that affects device performance and complicates the process in large-area devices. This patent also mentions that when InGaAsP bulk material is formed on the GaAs substrate, there will be many lattice-matched materials available, and InGaAsP provides tensile strain and can reduce stress caused by other processes. The 839 patent also teaches that when $Al_xGa_{1-x}As$ bulk material is formed on the GaAs substrate, $Al_xGa_{1-x}As$ will generate some compressive stress, thereby causing the performance and process problems.

The feature of the 839 patent is that the two materials are lattice-matched, that is, the substrate is a GaAs substrate, and the bulk material is $Al_xGa_{1-x}As_zP_{1-z}$, in particular, $Al_xGa_{1-x}As_zP_{1-z}$ is lattice-matched to the GaAs substrate; alternatively, the lattice constant of $Al_xGa_{1-x}As_zP_{1-z}$ can be smaller than the lattice constant of the GaAs substrate so as to achieve that the overall structure is kept flat or under a state of tensile strain.

SUMMARY

However, in fact, it is found that the VCSEL epitaxial wafer made according to the method disclosed in the 839 patent has many dislocations or defects in the VCSEL epitaxial wafer, or there are too many dislocations or defects on some portions of the VCSEL epitaxial wafer (on the wafer uniformity issue). Accordingly, it is easy to cause the reliability of the VCSEL to deteriorate. Even as described in the 839 patent, the lattice constant of the AlGaAsP bulk structure can just lattice-match the lattice constant of the GaAs substrate, but the temperature during the growth process is much higher than room temperature, and the thermal expansion coefficients of the AlGaAsP and GaAs are different. Therefore, the AlGaAsP layer will have tensile strain at a higher temperature. In fact, during the epitaxial growth of the VCSEL epitaxial wafer, the AlGaAsP layer is more likely to cause dislocations or defects under tensile strain than under compressive stain.

In the wafer growth of the VCSEL epitaxial wafer, when the AlGaAsP epitaxial layer is grown on the GaAs substrate, it is limited by the material composition uniformity on the entire epitaxial wafer. The lattice constant of each portion of the AlGaAsP epitaxial layer is difficult to exactly lattice-match the lattice constant of the GaAs substrate on the entire epitaxial wafer. Some portions of the AlGaAsP epitaxial layer may have higher phosphorus composition. The portions with higher phosphorus composition will have tensile strain at room temperature because the lattice constant thereof is lower than that of the GaAs substrate. Since the temperature during the epitaxial growth is much higher than room temperature, the tensile strain of the portion of the AlGaAsP epitaxial layer that contains higher phosphorus composition will be greater. The greater the tensile strain is, the more easily the VCSEL epitaxial wafer has dislocations or defects.

The method provided by the 839 patent may indeed have the described effect for solar epitaxial wafers or avalanche photo diode. However, it causes excessive dislocations or defects in all or part of the VCSEL epitaxial wafer, thereby causing the problem of reliability or yield of the VCSEL.

The present disclosure provides a VCSEL with a compressive stress DBR layer. The VCSEL includes a GaAs substrate, a lower DBR layer, a lower spacer layer, an active region, an upper spacer layer and an upper DBR layer. The lower DBR layer and the lower spacer layer are disposed above the GaAs substrate and below the active region. The upper DBR layer and the upper spacer layer are disposed above the active region. The lower DBR layer and the upper DBR layer are respectively formed by alternately stacking multiple low refractive index layers and multiple high refractive index layers, wherein the lower DBR layer, the lower spacer layer, the upper spacer layer or the upper DBR layer contains $Al_xGa_{1-x}As_{1-y}P_y$, where $0<x\le1$, and wherein at room temperature, a lattice constant of $Al_xGa_{1-x}As_{1-y}P_y$ is greater than that of the GaAs substrate.

A phosphorus composition in $Al_xGa_{1-x}As_{1-y}P_y$ of the low refractive index layers is $0<y\le0.03$, and a phosphorus composition in $Al_xGa_{1-x}As_{1-y}P_y$ of the high refractive index layers is $0<y\le0.015$.

In one embodiment, the lower DBR layer is an N-type DBR layer and at least one portion of the upper DBR layer is a P-type DBR layer. The lower DBR layer and the upper DBR layer respectively include multiple low refractive index layers and multiple high refractive index layers, wherein the material of at least a part of the low refractive index layer and/or the high refractive index layer is $Al_xGa_{1-x}As_{1-y}P_y$. Alternatively, when the lower DBR layer is an N-type DBR layer, the upper DBR layer at least includes a P-type DBR layer or includes both a P-type DBR layer and an N-type DBR layer. The material of at least a part of the N-type DBR layer of the lower DBR layer, at least a part of the P-type DBR layer of the upper DBR layer, or at least a part of the N-type DBR layer of the upper DBR Layer is $Al_xGa_{1-x}As_{1-y}P_y$.

In one embodiment, one of the lower DBR layer and the upper DBR layer is an N-type DBR layer and the other is a P-type DBR layer. The lower DBR layer and the upper DBR layer are respectively formed by alternately stacking multiple low refractive index layers and multiple high refractive index layers, wherein the material of at least a part of the low refractive index layer and/or the high refractive index layer is $Al_xGa_{1-x}As_{1-y}P_y$. Alternatively, when the lower DBR layer is a P-type DBR layer, the upper DBR layer at least includes an N-type DBR layer or includes both an N-type DBR layer and a P-type DBR layer. The material of at least a part of the P-type DBR layer of the lower DBR layer, at least a part of the N-type DBR layer of the upper DBR layer, or at least a part of the P-type DBR layer of the upper DBR layer is $Al_xGa_{1-x}As_{1-y}P_y$.

In one embodiment, one of the lower DBR layer and the upper DBR layer is an N-type DBR layer and the other thereof is a P-type DBR layer. The low refractive index layer and/or the high refractive index layer made of $Al_xGa_{1-x}As_{1-y}P_y$ may be disposed in the N-type DBR layer.

In one embodiment, one of the lower DBR layer and the upper DBR layer is an N-type DBR layer and the other thereof is a P-type DBR layer. The low refractive index layer and/or the high refractive index layer made of $Al_xGa_{1-x}As_{1-y}P_y$ may be disposed in the P-type DBR layer.

In one embodiment, one of the lower DBR layer and the upper DBR layer is an N-type DBR layer and the other thereof is a P-type DBR layer. The low refractive index layer and/or the high refractive index layer made of $Al_xGa_{1-x}As_{1-y}P_y$ may be disposed in the N-type DBR layer and the P-type DBR layer.

In one embodiment, the materials of the low refractive index layer and the high refractive index layer are $Al_xGa_{1-x}As_{1-y}P_y$.

In one embodiment, in the low refractive index layer made of $Al_xGa_{1-x}As_{1-y}P_y$, $0.7\le x\le1$.

In one embodiment, in the high refractive index layer made of $Al_xGa_{1-x}As_{1-y}P_y$, $0<x\le0.5$.

In one embodiment, the low refractive index layer and/or the high refractive index layer made of $Al_xGa_{1-x}As_{1-y}P_y$ is a material uniform region.

In one embodiment, the low refractive index layer and/or the high refractive index layer made of $Al_xGa_{1-x}As_{1-y}P_y$ is a material non-uniform region.

In one embodiment, the present disclosure further includes a bandgap graded layer. The bandgap graded layer is disposed between a pair of the low refractive index layer and the high refractive index layer. The bandgap graded layer comprises a plurality of bandgaps, the plurality of bandgaps of the bandgap graded layer will gradually increase or decrease, one of or some of the plurality of bandgaps of the bandgap graded layer close to the high refractive index layer is/are relatively small, and one of or some of the plurality of bandgaps of the bandgap graded layer close to the low refractive index layer is/are relatively large. The bandgap graded profile of the bandgap graded layer can be an appropriate change for assisting carrier movement, such as a linear graded bandgap, a non-linear graded bandgap, a step graded bandgap or a combination thereof, etc.

According to the present disclosure, the material of the bandgap graded layer may be $Al_xGa_{1-x}As$ or $Al_xGa_{1-x}As_{1-y}P_y$.

When the bandgap graded layer is disposed in the lower DBR layer, the bandgap graded layer is disposed between the high refractive index layer and the low refractive index layer, wherein, the high refractive index layer is below the bandgap graded layer, and the low refractive index layer is above the bandgap graded layer.

When the bandgap graded layer is disposed in the upper DBR layer, the bandgap graded layer is disposed between the low refractive index layer and the high refractive index layer, wherein, the low refractive index layer is below the bandgap graded layer, and the high refractive index layer is above the bandgap graded layer.

In one embodiment, the above active region further includes two or more active layers. Preferably, an inner spacer layer is provided between two adjacent active layers or between each two adjacent active layers. The inner spacer layer between two adjacent active layers may include $Al_xGa_{1-x}As_{1-y}P_y$, where the lattice constant of $Al_xGa_{1-x}As_{1-y}P_y$ is greater than that of the GaAs substrate at room temperature.

Since the lattice between the $Al_xGa_{1-x}As_{1-y}P_y$ material and the GaAs substrate is relatively matched, the $Al_xGa_{1-x}As_{1-y}P_y$ material generates compressive strain and the compressive strain is small. Therefore, the accumulation of compressive strain in the VCSEL can be reduced and the occurrence of significant tensile strain can be avoided, thereby improving the reliability of the VCSEL, reducing the difficulty of device fabrication, or reducing the risk of wafer cracking.

DESCRIPTION OF THE EMBODIMENTS

Figure 1:
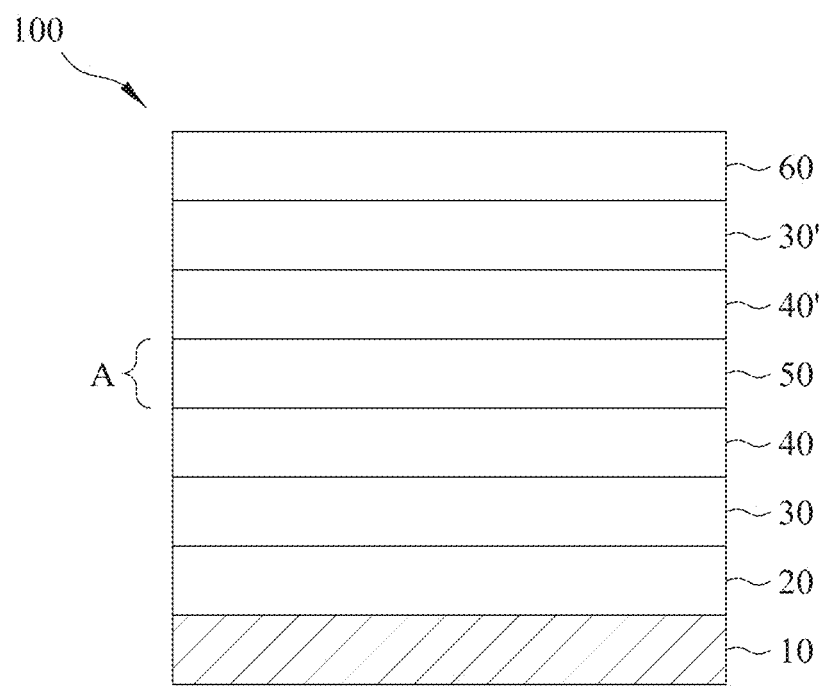
FIG. 1 is a schematic diagram showing the structure of a VCSEL according to one embodiment of the present disclosure.

The embodiment of the present disclosure is described in detail below with reference to the drawings and element symbols, such that persons skilled in the art is able to implement the present application after understanding the specification of the present disclosure.

Specific examples of components and arrangements are described below to simplify the present disclosure. These are, of course, merely examples and they are not intended to limit the scope of the present disclosure. In the present disclosure, for example, when a layer formed above or on another layer, it may include an exemplary embodiment in which the layer is in direct contact with the another layer, or it may include an exemplary embodiment in which other devices or epitaxial layers are formed between thereof, such that the layer is not in direct contact with the another layer. In addition, repeated reference numerals and/or notations may be used in different embodiments, these repetitions are only used to describe some embodiments simply and clearly, and do not represent a specific relationship between the different embodiments and/or structures discussed.

Further, spatially relative terms, such as "underlying," "below," "lower," "overlying," "above," "upper" and the like, may be used herein for ease of description to describe one device or feature's relationship to another device(s) or feature(s) as illustrated in the figures and/or drawings. The spatially relative terms are intended to encompass different orientations of the device in use or operation in addition to the orientation depicted in the figures and/or drawings.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of the present disclosure are not necessarily all referring to the same embodiment.

Furthermore, the particular features, structures or characteristics may be combined in any suitable manner in one or more embodiments of the present disclosure. Further, for the terms "including", "having", "with", "wherein" or the foregoing transformations used herein, these terms are similar to the term "comprising" to include corresponding features.

In addition, a "layer" may be a single layer or a plurality of layers; and "a portion" of an epitaxial layer may be one layer of the epitaxial layer or a plurality of adjacent layers.

In the prior art, the laser diode can be optionally provided with a buffer layer according to actual needs, and in some embodiments, the materials of the buffer and the substrate may be the same. Whether the buffer is provided is not substantially related to the technical characteristics to be described in the following embodiments and the effects to be provided. Accordingly, for the sake of a brief explanation, the following embodiments are only described with a laser diode having a buffer layer, and no further description is given to a laser without a buffer layer; that is, the following embodiments can also be applied by replacing a laser diode without a buffer.

Referring to FIG. 1, FIG. 1 is a schematic diagram of the structure of a VCSEL according to one embodiment of the present disclosure. As shown in FIG. 1, the structure of the VCSEL 100 (from bottom to top) includes a GaAs substrate 10, a buffer layer 20, a lower DBR layer 30, a lower spacer layer 40, an active region A including an active layer 50, an upper spacer layer 40', an upper DBR layer 30' and an ohmic contact layer 60. The buffer layer 20, the active layer 50 and the ohmic contact layer 60 are made of conventional semiconductor materials, and formed by epitaxial growth. The semiconductor materials of these structures are not repeated here. The active region A in FIG. 1 includes an active layer 50, but not limited thereto. The active region A may also include two or more active layers. Preferably, an inner spacer layer (not shown) is provided between two adjacent active layers or between each two adjacent active layers.

Figure 2:
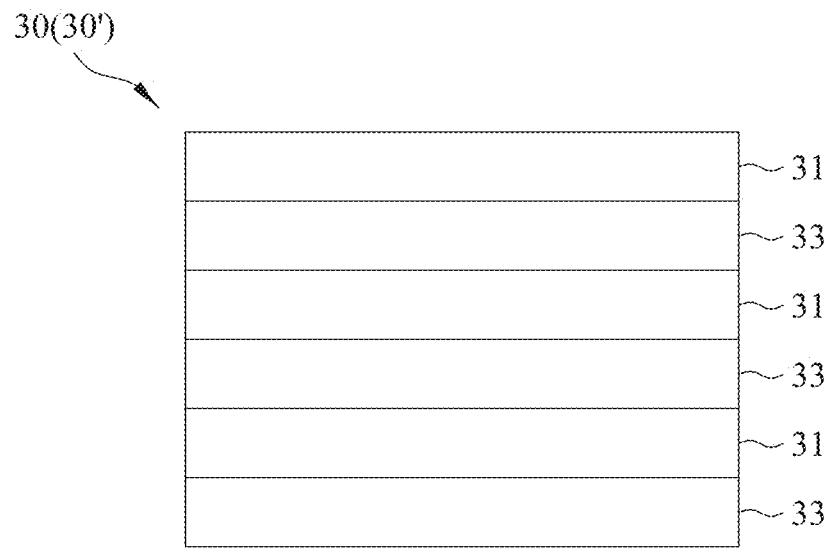
FIG. 2 is a schematic diagram showing the structure of a DBR layer according to one embodiment of the present disclosure.

Referring to FIG. 2, an exemplary structure of the lower DBR layer 30 or the upper DBR layer 30' (hereinafter referred to as DBR layers 30 and 30') includes multiple low refractive index layers 31 and multiple high refractive index layers 33. The multiple low refractive index layers 31 and the multiple high refractive index layers 33 are alternately stacked to form a periodic structure. When the number of stacked layers is greater, the total reflectivity of the DBR layers 30, 30' to a specific wavelength is closer to 100%. In addition, when the refractive index difference between the low refractive index layer 31 and the high refractive index layer 33 is greater, the DBR layers 30, 30' generally have higher total reflectivity. Although FIG. 2 shows only three pairs of stacked structures, the DBR layers 30, 30' may have dozens of pairs of stacked structures in accordance with the required total reflectivity. The above-mentioned pair of stacked structures includes a low refractive index layer and a high refractive index layer. The low refractive index layer can be above or below the high refractive index layer, or vice versa.

Although the bottom layer of the DBR layer 30, 30' shown in FIG. 2 is the high refractive index layer 33, a multi-layer structure can be formed by alternately stacking the low refractive index layers 31 and the high refractive index layers 33. Certainly, the bottom layer of the DBR layer 30, 30' may also be the low refractive index layer 31, and a multi-layer structure can be formed by alternately stacking the high refractive index layers 33 and the low refractive index layers 31.

In order to increase the total reflectivity of the DBR layers 30, 30', the low refractive index layer 31 may generally be made of a material containing a high aluminum composition. In one embodiment, the material containing a high aluminum composition may be AlGaAs. The material of the high refractive index layer 33 can be selected from the material containing a low aluminum composition or the material not containing aluminum. In one embodiment, the material containing a low aluminum composition may be AlGaAs, and the material not containing aluminum may be GaAs. That is, the reflectivity of the DBR layers 30, 30' is changed by adjusting the difference in the aluminum composition between the low refractive index layer and the high refractive index layer. However, due to the lattice mismatch between the AlGaAs material and the GaAs substrate, a large compressive strain will be generated. Besides, the DBR layers 30, 30' are usually composed of dozens of pairs of stacked structures such that the accumulated compressive strain will cause the epitaxial wafer to bow or cause the epitaxial layer of the VCSEL 100 to generate the defect or dislocation due to the accumulated excessive compressive strain. This will result in poor reliability of the VCSEL.

In order to solve the above-mentioned problems, phosphorus can be added to "at least a part" of the multiple low refractive index layers 31, or phosphorus can be added to at least a part of the multiple high refractive index layers 33, alternatively, phosphorus is added to at least a part of the multiple low refractive index layers 31 and the multiple high refractive index layers 33 such that the compressive strain of the DBR layer is moderately reduced, whereby reducing the warpage of the epitaxial wafer, or reducing or eliminating the defect or dislocation of the epitaxial layer.

The so-called "at least a part of the multiple low (high) refractive index layers" is one, two, three or selected layers of the multiple low (high) refractive index layers. If necessary, phosphorus may be added to most of the selected layers of the multiple low (high) refractive index layers or even each layer thereof.

Taking the material(s) of the low refractive index layer 31 and/or the high refractive index layer 33 described above being AlGaAs as an example, after phosphorus is added to the low refractive index layer 31 and/or the high refractive index layer 33, the material(s) of the low refractive index layer 31 and/or the high refractive index layer 33 will be $Al_xGa_{1-x}As_{1-y}P_y$, in which the lattice constant of $Al_xGa_{1-x}As_{1-y}P_y$ is greater than the lattice constant of the GaAs substrate at room temperature. In addition to the upper DBR layer and the lower DBR layer, $Al_xGa_{1-x}As_{1-y}P_y$ can also be used for the upper spacer layer or the lower spacer layer outside the active region, or the inner spacer layer inside the active region, wherein the lattice constant of $Al_xGa_{1-x}As_{1-y}P_y$ is greater than the lattice constant of the GaAs substrate at room temperature.

The so-called "phosphorus (is) added" refers to the step of adding the source of phosphorus into the reactor in the process of epitaxial growth. $Al_xGa_{1-x}As_{1-y}P_y$ can reduce the lattice mismatch between the epitaxial layer and the GaAs substrate 10, that is, under the same aluminum composition of $Al_xGa_{1-x}As_{1-y}P_y$ and AlGaAs, the difference between the lattice constant of $Al_xGa_{1-x}As_{1-y}P_y$ and the lattice constant of the GaAs substrate will be smaller than the difference between the lattice constant of AlGaAs and the lattice constant of the GaAs substrate. Accordingly, the accumulation of compressive strain is moderately reduced, that is, the upper DBR layer, the upper spacer layer, the lower spacer layer, the lower DBR layer or the inner spacer layer has moderate compressive strain, thereby avoiding the warpage, reducing the defects or dislocations of the VCSEL 100. In addition, $Al_xGa_{1-x}As_{1-y}P_y$ is prevented from generating tensile strain at room temperature. Further, after adding phosphorus to the upper DBR layer, the upper spacer layer, the lower spacer layer, the lower DBR layer or the inner spacer layer, the AlGaAsP is less likely to be oxidized than AlGaAs. Consequently, during the oxidation process, the AlGaAsP epitaxial layer will be oxidized less such that the stress of the VCSEL containing the AlGaAsP epitaxial layer can be appropriately reduced, thereby helping to improve the reliability of the VCSEL. It should be noted that the lattice constant of $Al_xGa_{1-x}As_{1-y}P_y$ must be greater than the lattice constant of the GaAs substrate at room temperature. Preferably, there is an appropriate difference or margin between the lattice constant of $Al_xGa_{1-x}As_{1-y}P_y$ and the lattice constant of the GaAs substrate. During the epitaxial growth of $Al_xGa_{1-x}As_{1-y}P_y$, even though the temperature of epitaxial growth is high, $Al_xGa_{1-x}As_{1-y}P_y$ still has compressive strain or avoids significant tensile strain so as to improve the reliability of the VCSEL or reduce deformation of the VCSEL epitaxial wafer.

When the refractive index difference between the low refractive index layer 31 and the high refractive index layer 33 is larger, the DBR layers 30, 30' can obtain higher reflectivity as expected for a specific wavelength. In addition, the aluminum composition of $Al_xGa_{1-x}As_{1-y}P_y$ in the low refractive index layer 31 and/or the high refractive index layer 33 may be $0<x\leq1$, that is, as long as the aluminum composition of the low refractive index layer 31 is higher than the aluminum composition of the high refractive index layer 33. Preferably, the aluminum composition of the low refractive index layer 31 may be $0.7\leq x\leq1$, and the aluminum composition of the high refractive index layer 33 may be $0<x\leq0.5$. By means of adjusting the aluminum composition, the refractive index difference between the low refractive index layer 31 and the high refractive index layer 33 can be increased, thereby increasing the total reflectivity of the DBR layers 30, 30'. When the refractive index difference is larger, the number of stacked layers in the DBR layers 30, 30' can also be reduced such that the total thickness thereof is reduced and the certain total reflectivity is maintained.

Taking the low refractive index layer 31 as an example, increasing aluminum composition in the AlGaAs or AlGaAsP low refractive index layer can lower the refractive index, but will generate more compressive strain. Adding phosphorus to AlGaAs or increasing phosphorus composition in the AlGaAsP low refractive index layer can reduce the compressive strain. If the additive amount of phosphorus composition is positively correlated with the additive amount of aluminum composition in the AlGaAsP low refractive index layer, the compressive strain of the AlGaAsP low refractive index layer could be the same. However, the additive amount of phosphorus composition should be appropriate. If the composition of phosphorus is too high, there will be a change in the refractive index, or it will cause problems such as tensile strain induced in the AlGaAsP low refractive index layer because the lattice constant thereof is equal to or less than the lattice constant of the GaAs substrate. As such, the phosphorus composition in $Al_xGa_{1-x}As_{1-y}P_y$ of the low refractive index layer 31 may be approximately $0<y\leq0.03$, wherein the phosphorus composition may be 0.03, 0.025, 0.024, 0.023, 0.022, 0.021, 0.02, 0.019, 0.018, 0.017, 0.016, 0.015, 0.013, 0.01 or 0.007. Additionally, the phosphorus composition in $Al_xGa_{1-x}As_{1-y}P_y$ of the high refractive index layer 33 may be $0<y\leq0.015$, where the phosphorus composition may be 0.015, 0.01, 0.008, 0.007, 0.0065, 0.006, 0.0055, 0.005, 0.0045, 0.004, 0.0035, 0.003, 0.002 or 0.001. The phosphorus composition in $Al_xGa_{1-x}As_{1-y}P_y$ can be measured by X-ray spectroscopy. The test object may be epitaxial growth of an $Al_xGa_{1-x}As_{1-y}P_y$ bulk epitaxial layer with the fixed aluminum and gallium composition on the GaAs substrate or in a VCSEL epitaxial wafer.

In principle, when the high refractive index layer has tensile strain, the amount of phosphorus composition added to the low refractive index layer can be determined appropriately to cause the low refractive index layer to have compressive strain; therefore, the compressive strain generated by the low refractive index layer can compensate the tensile strain of the high refractive index layer, and reduce the total stain of the DBR layers.

Since the aluminum composition in the low refractive index layer 31 is greater than the aluminum composition in the high refractive index layer 33, the phosphorus composition in the low refractive index layer 31 may be greater than the phosphorus composition in the high refractive index layer 33.

If the lower DBR layer 30 is an N-type DBR layer, the upper DBR layer 30' may be a P-type DBR layer, and the N-type and P-type layers may be swapped as needed, as long as one of the DBR layers 30, 30' is an N-type DBR layer and the other is a P-type DBR layer, that is, a P-N diode structure is formed. The low refractive index layer 31 and/or the high refractive index layer 33 made of $Al_xGa_{1-x}As_{1-y}P_y$ can be disposed in the N-type DBR layer or the P-type DBR layer; alternatively, the materials of the low refractive index layer 31 and the high refractive index layer 33 of the N-type DBR layer and the P-type DBR layer are all $Al_xGa_{1-x}As_{1-y}P_y$.

When the materials of the low refractive index layer 31 and the high refractive index layer 33 of the N-type DBR layer and the P-type DBR layer are all $Al_xGa_{1-x}As_{1-y}P_y$, the compressive strain generated in the DBR layers 30, 30' can be reduced, thereby reducing the accumulation of the compressive strain in the VCSEL 100.

When the $Al_xGa_{1-x}As_{1-y}P_y$ low refractive index layer 31 is provided in the N-type DBR layer, the accumulation of compressive strain in the VCSEL 100 can also be reduced. In addition, increasing phosphorus composition in the $Al_xGa_{1-x}As_{1-y}P_y$ low refractive index layer 31 will increase the bandgap of the low refractive index layer 31. The increase of this bandgap has a slight impact on the electronics moving on the conduction band. As a result, the low refractive index layer 31 made of $Al_xGa_{1-x}As_{1-y}P_y$ can be provided only in the N-type DBR layer. When the P-type DBR layer is provided with the high refractive index layer 33 made of $Al_xGa_{1-x}As_{1-y}P_y$, the accumulation of compressive strain in the VCSEL 100 can also be relatively reduce. Additionally, increasing phosphorus composition in the $Al_xGa_{1-x}As_{1-y}P_y$ high refractive index layer will increase the bandgap of the $Al_xGa_{1-x}As_{1-y}P_y$ high refractive index layer. The increase of this bandgap has a slight impact on the holes moving on the valence band. As such, the high refractive index layer 33 made of $Al_xGa_{1-x}As_{1-y}P_y$ can be provided only in the P-type DBR layer.

At least a part of the low refractive index layer 31 or the high refractive index layer 33 being $Al_xGa_{1-x}As_{1-y}P_y$ means that a phosphorus element can be added to AlGaAs with a low aluminum composition and/or a phosphorus element can be added to AlGaAs with a high aluminum composition. Preferably, the phosphorus element can be added only to AlGaAs with a high aluminum composition so as to appropriately reduce the large compressive strain caused by the high aluminum composition. When the high refractive index layer 33 is AlGaAs with a low aluminum composition or GaAs, the compressive strain of the high refractive index layer 33 is small, and the addition of a phosphorus element is also unnecessary.

In addition, a specific number of layers can be selected from multiple low refractive index layers 31 to add the phosphorus element. For example, when the DBR layers 30, 30' are composed of 40 groups of periodic structures, 40, 30 or 20 layers can be selected from the 40 low refractive index layers 31 to include the phosphorus element, but not limited to the number of layers. The number of layers to be added with phosphorus can be adjusted according to the degree of compressive strain to be reduced. Similarly, when the phosphorus element is added to the high refractive index layer 33, a specific number of layers may be selected to add the phosphorus element according to needs.

For a single layer of the low refractive index layer 31 or high refractive index layer 33 composed of $Al_xGa_{1-x}As_{1-y}P_y$, if a constant concentration of phosphorus source is added throughout the epitaxial growth, a $Al_xGa_{1-x}As_{1-y}P_y$ material uniform region with a substantially uniform phosphorus composition can be formed.

In one embodiment, a portion of the material non-uniform region may be $Al_xGa_{1-x}As_{1-y}P_y$, while other portions are $Al_xGa_{1-x}As$. For example, in the process of forming the low refractive index layer 31, a phosphorus source is added only during the ⅓ of $Al_xGa_{1-x}As$ epitaxial layer growth. Consequently, about ⅓ of the low refractive index layer is $Al_xGa_{1-x}As_{1-y}P_y$, and the remaining ⅔ thereof is $Al_xGa_{1-x}As$, thereby forming the material non-uniform region. In one embodiment, the middle part of the material non-uniform region is $Al_xGa_{1-x}As_{1-y}P_y$, the upper part above the middle part and the lower part below the middle part are $Al_xGa_{1-x}A$, and the actual thickness of the middle part in the low refractive index layer can be adjusted according to needs. In one embodiment, the material non-uniform region includes the two or more portions, the material of each portion is AlGaAsP, wherein the material composition between at least two portions is different. For example, the material non-uniform region includes first portion and second portion, the materials of the first portion and the second portion are AlGaAsP, wherein the phosphorus composition of the first portion may be more or less than that of the second portion.

In the above description, when the aluminum composition in the low refractive index layer 31 is $0.7\leq x\leq 1$, the bandgap is large. When the aluminum composition in the high refractive index 33 is $0<x\leq 0.5$, the bandgap is relatively small. When the aluminum composition between the low refractive index layer and the high refractive index layer is different, a discontinuity between the conduction band and valence band will occur at the junction between the low refractive index layer and the high refractive index layer. As a result, the carrier will encounter a large potential barrier height when flowing, resulting in an increase in resistance.

Figure 3:
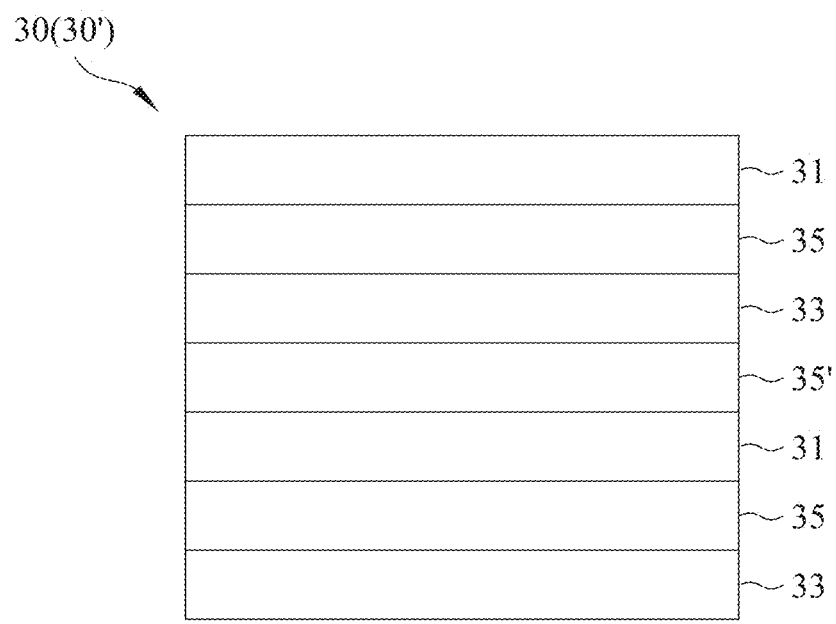
FIG. 3 is a schematic diagram showing the structure of a DBR layer having bandgap graded layer according to one embodiment of the present disclosure.

As shown in FIG. 3, the DBR layer 30 and/or the DBR layer 30' may further include bandgap graded layer 35, 35' provided between the low refractive index layer 31 and the high refractive index layer 33. The bandgap graded layer 35, 35' may include $Al_xGa_{1-x}As$ or $Al_xGa_{1-x}As_{1-y}P_y$, where the bandgaps of the bandgap graded layer will gradually increase or decrease. In principle, one of or some of the bandgaps of the bandgap graded layer close to the high refractive index layer is/are relatively small, while one of or some of the bandgaps of the bandgap graded layer close to the low refractive index layer is/are relatively large. The bandgap of the bandgap graded layer may be selected from the group consisting of linear graded bandgap, nonlinear graded bandgap, step graded bandgap and other suitable graded bandgap.

The bandgap can be gradually changed by adjusting the material composition or by other suitable methods. Taking $Al_xGa_{1-x}As_{1-y}P_y$ as an example, the bandgap can be gradually changed by adjusting aluminum or gallium composition. For example, the aluminum composition gradually changes from high to low in the direction of the low refractive index layer 31 toward the high refractive index layer 33. For example, the aluminum composition of the bandgap graded layer 35 gradually changes from low to high in the direction from bottom to top, as shown in FIG. 3, and the aluminum composition of the bandgap graded layer 35' gradually changes from high to low in the direction from bottom to top, as shown in FIG. 3. Accordingly, the energy levels of the conduction band and the valence band are gradually changed, thereby reducing or eliminating the carrier potential barrier height between the low refractive index layer 31 and the high refractive index layer 33, and avoiding an increase in resistance. For example, the aluminum composition in the low refractive index layer 31 is x=0.9, and the aluminum composition in the high refractive index layer 33 is x=0.1. The aluminum composition of the bandgap graded layer 35, 35' may be about $0.1 \leq x \leq 0.9$, and the aluminum composition may gradually decrease in the direction of the low refractive index layer 31 toward the high refractive index layer 33. The upper limit and lower limit of the aluminum composition in the bandgap graded layers 35, 35' are not limited to be exactly the same as the aluminum composition in the low refractive index layer 31 and the high refractive index layer 33. They can be adjusted without significantly affecting the resistance.

Taking $Al_xGa_{1-x}As_{1-y}P_y$ as an example, the bandgaps of the $Al_xGa_{1-x}As_{1-y}P_y$ can be increased or decreased gradually by adjusting aluminum, gallium or phosphorus composition, or by adjusting two or more of aluminum, gallium and phosphorus composition.

FIG. 3 shows a preferred implementation structure. Since the N-type DBR layer and the P-type DBR layer are different, the bandgap graded layer may be provided only between the high refractive index layer 33 and the low refractive index layer 31; alternatively, only the bandgap graded layer is provided between the low refractive index layer 31 and the high refractive index layer 33.

Specifically, when the lower DBR layer is N-type and when the high refractive index layer 33 is below the low refractive index layer, the bandgap graded layer 35 is provided between the high refractive index layer 33 and the low refractive index layer 31. That is, the high refractive index layer 33 is under the bandgap graded layer 35 and the low refractive index layer 31 is on the bandgap graded layer 35. When the low refractive index layer 31 is below the high refractive index layer 33, as for whether the bandgap graded layer 35' needs to be provided between the low refractive index layer 31 and the high refractive index layer 33, it depends on the actual requirements.

When the upper DBR layer is P-type and when the low refractive index layer 31 is below the high refractive index layer 33, that is, the low refractive index layer 31 is in the lower layer and the high refractive index layer 33 is in the upper layer, the bandgap graded layer 35' is provided between the low refractive index layer and the high refractive index layer. When the high refractive index layer 33 is below the low refractive index layer 31, as for whether the bandgap graded layer 35' needs to be provided between the low refractive index layer 31 and the high refractive index layer 33, it depends on the actual requirements.

Figure 4:
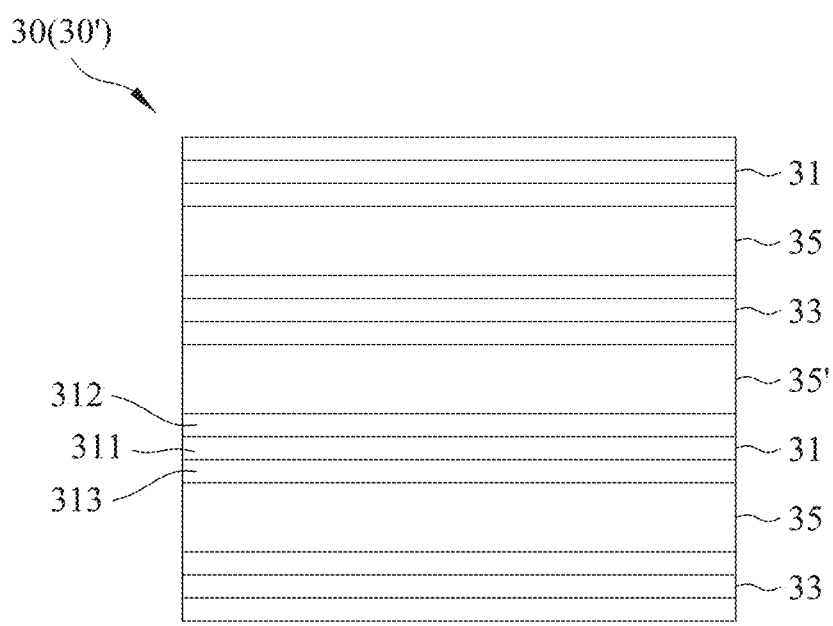
FIG. 4 is a detailed schematic diagram showing the structure of a DBR layer having material non-uniform regions according to one embodiment of the present disclosure.

Referring to FIG. 4, the structures of FIG. 4 and FIG. 3 are the same, except that the low refractive index layer 31 in FIG. 4 further provides a material non-uniform region, and the material non-uniform region includes a middle part 311 between an upper part 312 and a lower part 313. Preferably, the material of middle part 311 is $Al_xGa_{1-x}As_{1-y}P_y$, and the materials of the upper part 312 and the lower part 313 are $Al_xGa_{1-x}As$. By disposing the material non-uniform region, the material non-uniform region and the bandgap graded layer, or the material uniform region and the bandgap graded layer, the carrier potential barrier height between the low refractive index layer 31 and the high refractive index layer 33 can be reduced or eliminated to avoid an increase in resistance.

The high refractive index layer 33 and the low refractive index layer 31 shown in FIG. 4 both provide a material non-uniform region. In some embodiments, the material non-uniform region or the material uniform region may be provided only in the low refractive index layer 31 or the high refractive index layer 33 according to actual needs.

Through the above description, by using $Al_xGa_{1-x}As_{1-y}P_y$ with a lattice constant greater than that of the GaAs substrate at room temperature as the DBR layer or spacer layer or inner space layer, the total compressive strain of the DBR layer or spacer layer can be adequately reduced, such that the DBR layer or spacer layer has appropriate compressive strain at room temperature, thereby avoiding the obvious tensile strain of the DBR layer or spacer layer during epitaxial growth. In this way, the problem of the warpage, defect or dislocation of the VCSEL epitaxial wafer can be avoided so as to improve the reliability, the process yield, or reducing the probability of wafer cracking of the VCSEL.

Further, the bandgap graded layer can also be provided between the low refractive index layer and the high refractive index layer of the DBR layer to reduce or eliminate the carrier potential barrier height between the low refractive index layer and the high refractive index layer, thereby avoiding an increase in resistance.

According to the present disclosure, the defects or dislocations in the VCSEL epitaxial layer are presented by X-ray topography (XRT) to show the dislocations of Comparative Embodiments 1, 2 and 3 and one embodiment of the present disclosure. The main structures of Comparative Embodiments 1, 2 and 3 and one embodiment of the present disclosure are the same as the VCSEL of FIG. 1. Only the material composition of the low refractive index layers of the upper DBR layer and the lower DBR layer are different, wherein the aluminum compositions thereof are the same, but the phosphorous compositions thereof are different. The material compositions of the other epitaxial layers are approximately the same, and the substrates are all GaAs.

Figure 5:
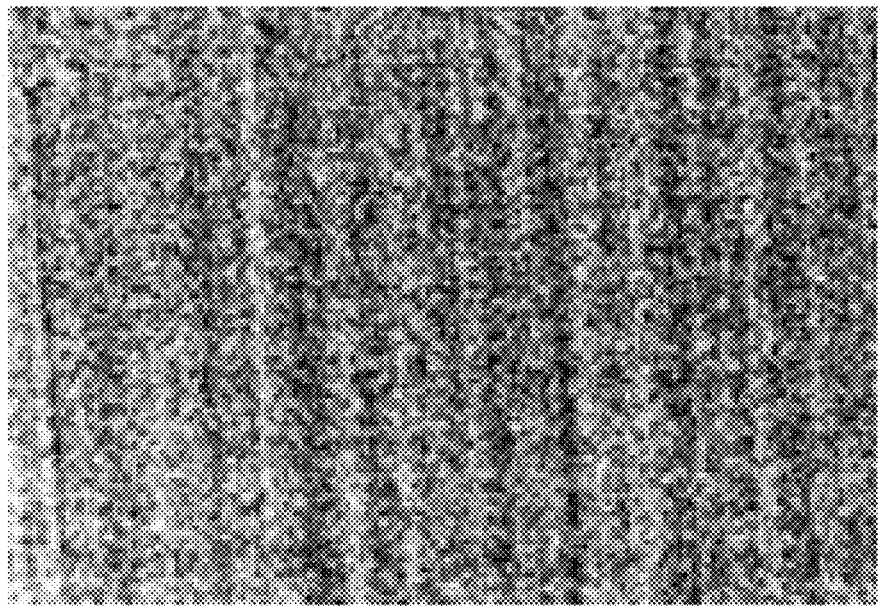
FIGS. 5 and 6 are XRT images of the center area and the edge area of the VCSEL epitaxial wafer of Comparative Embodiment 1.
Figure 6:
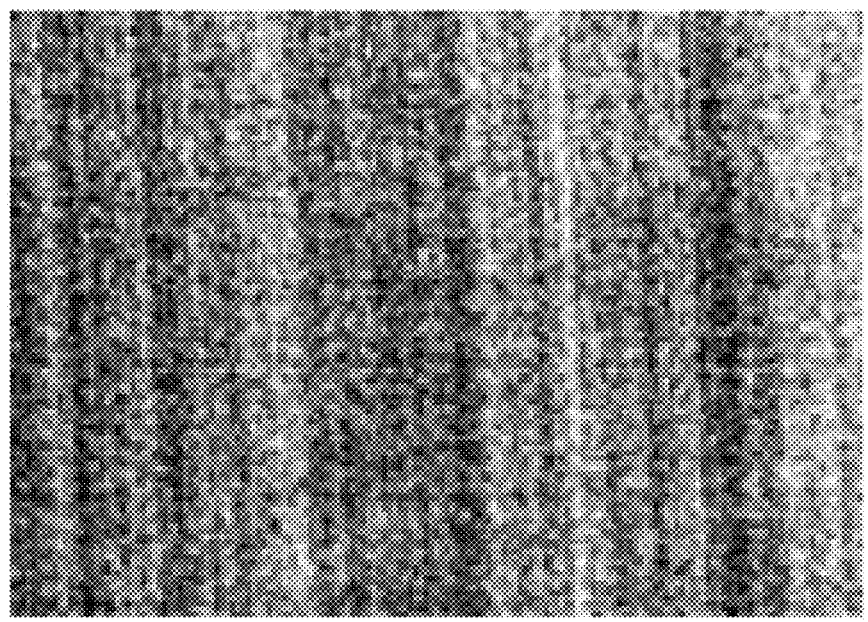

FIGS. 5 and 6 correspond to the VCSEL of Comparative Embodiment 1, in which the materials of the lower refractive index layers of the upper DBR layer and the lower DBR layer are AlGaAsP, and the lattice constant of AlGaAsP at room temperature is smaller than that of the GaAs substrate. Therefore, AlGaAsP will have tensile strain at room temperature, and will have greater tensile strain during epitaxial growth. It can be seen from the measurement results of FIGS. 5 and 6 that more obvious dark lines appear in FIGS. 5 and 6, and the dark lines represent dislocations.

Figure 7:
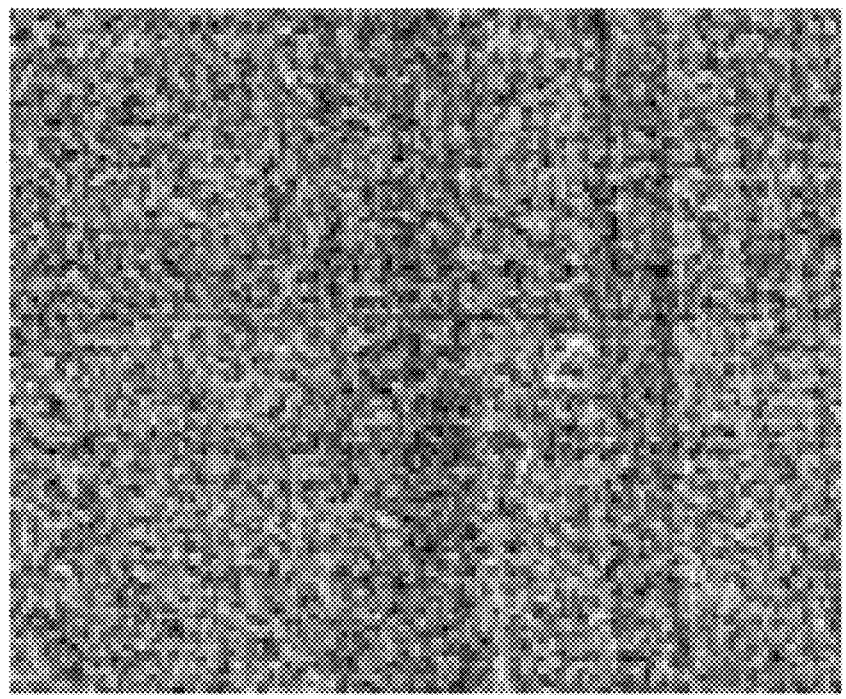
FIGS. 7 and 8 are XRT images of the center area and the edge area of the VCSEL epitaxial wafer of Comparative Embodiment 2.
Figure 8:
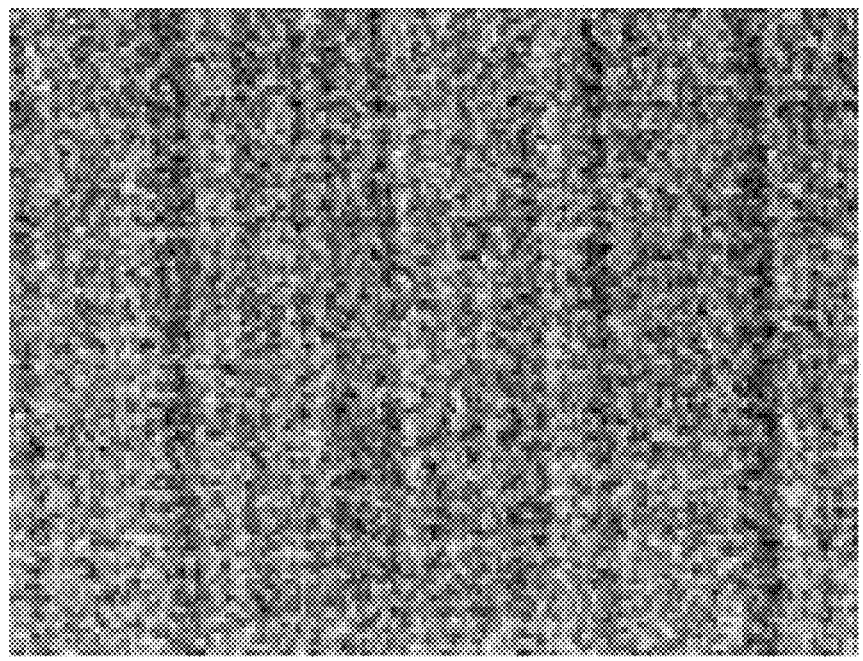

FIGS. 7 and 8 correspond to the VCSEL of Comparative Embodiment 2, in which the materials of the low refractive index layers of the upper DBR layer and the lower DBR layer are AlGaAsP, and the lattice constant of AlGaAsP is equal to the lattice constant of the GaAs substrate at room temperature. It can be seen from the measurement results of FIGS. 7 and 8 that there are many obvious dark lines in FIGS. 7 and 8, and there are more dark lines in the edge area of the VCSEL epitaxial wafer (FIG. 8) than the dark lines in the center area of the VCSEL epitaxial wafer (FIG. 7). One of the reasons is that even at room temperature the AlGaAsP can lattice match to the GaAs substrate, but the temperature during epitaxial growth process is much higher than room temperature, and the thermal expansion coefficients of the AlGaAsP and GaAs substrates are different. Accordingly, the AlGaAsP layer will have tensile strain at higher temperature. Another reason is that due to the phosphorous composition uniformity on the entire epitaxial wafer, the phosphorous composition of the AlGaAsP epitaxial layer is difficult to be exactly the same with the entire wafer, some areas on the wafer that may have more phosphorus composition. The areas with more phosphorus composition have tensile strain at room temperature because the lattice constants thereof are smaller than the lattice constant of the GaAs substrate. Since the temperature during epitaxial growth is much higher than room temperature, the tensile strain will be greater in the areas of the AlGaAsP epitaxial layer that contains more phosphorus.

Figure 9:
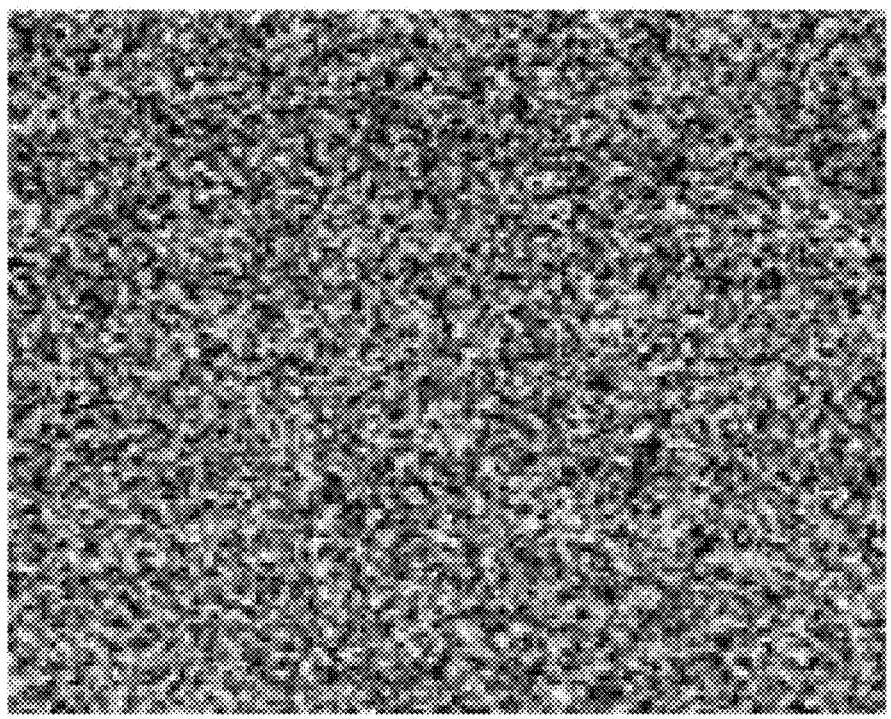
FIGS. 9 and 10 are XRT images of the center area and the edge area of the VCSEL epitaxial wafer according to one embodiment of the present disclosure.
Figure 10:
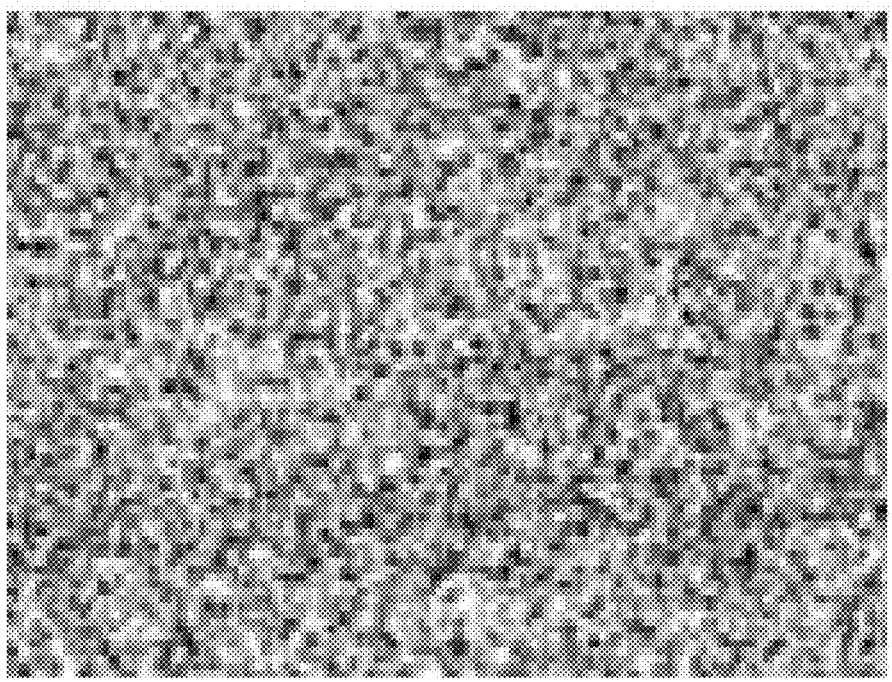

FIGS. 9 and 10 correspond to the VCSEL according to one embodiment of the present disclosure, in which AlGaAsP is used as the materials of the low refractive index layers of the upper DBR layer and the lower DBR layer. At room temperature, the lattice constant of AlGaAsP is slightly larger than the lattice constant of the GaAs substrate. Therefore, AlGaAsP has no strain or appropriate compressive strain during epitaxial growth. It can be seen from the measurement results of FIGS. 9 and 10, there are not dark lines in FIGS. 9 and 10.

Figure 11:
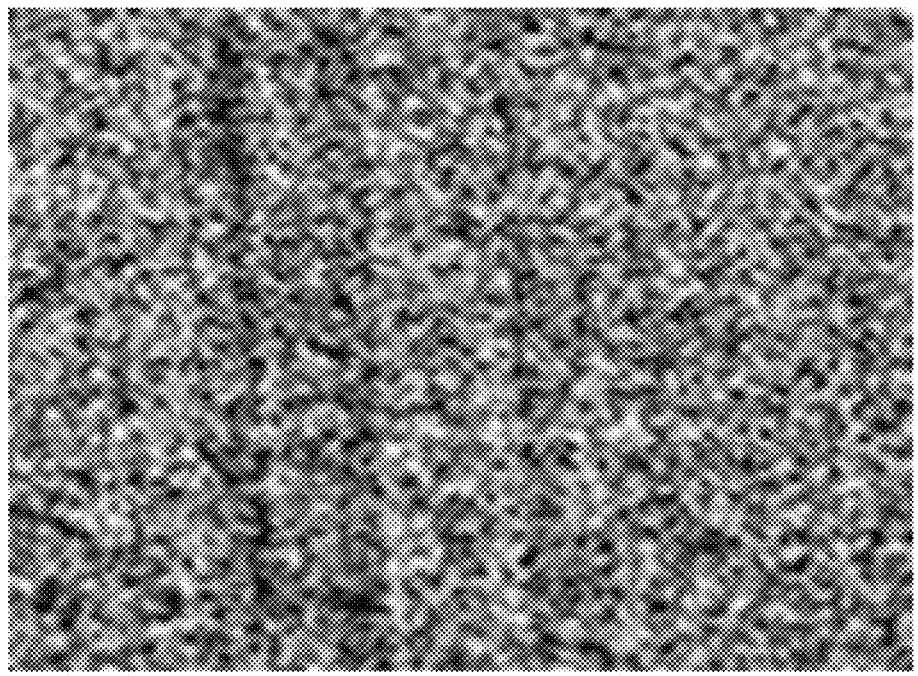
FIGS. 11 and 12 are XRT images of the center area and the edge area of the VCSEL epitaxial wafer of Comparative Embodiment 3.
Figure 12:
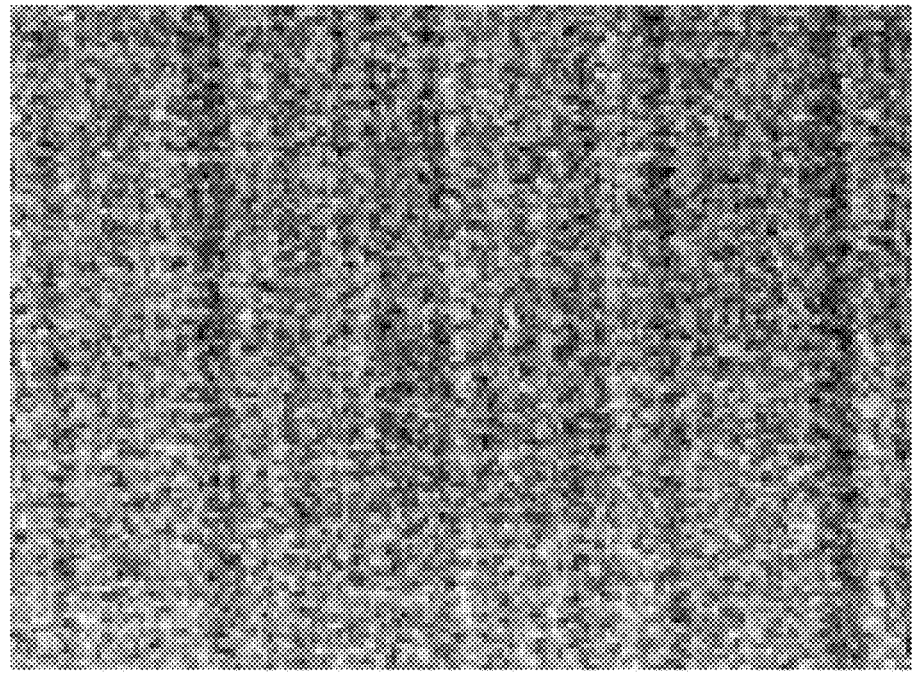

FIGS. 11 and 12 correspond to the VCSEL of Comparative Embodiment 3, in which AlGaAs is used as the materials of the low refractive index layer of the upper DBR layer and the lower DBR layer. The lattice constant of AlGaAs at room temperature is greater than the lattice constant of the GaAs substrate (the aluminum composition of AlGaAsP is the same as the aluminum composition of AlGaAs) such that AlGaAs will have large compressive strain. The large compressive strain will cause defects or dislocations in the VCSEL epitaxial wafer. It can be seen from the measurement results in FIGS. 11 and 12, there are also some dark lines in FIGS. 11 and 12.

According to the VCSEL made in the teaching of the 839 patent, in fact, since the epitaxial layer will have tensile strain during epitaxial growth, it is easier to cause serious defects or dislocations of the VCSEL epitaxial layer, thereby resulting in poor reliability of the VCSEL. In contrast to the teaching of the 839 patent, when the epitaxial layer has no strain or moderate compressive strain during epitaxial growth, the reliability of the VCSEL can actually be significantly improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A vertical cavity surface emitting laser diode (VCSEL) comprising an AlGaAsP layer with compressive strain, the VCSEL comprising:
   a GaAs substrate; a lower distributed Bragg reflector (DBR) layer; a lower spacer layer; an active region; an upper spacer layer; and an upper DBR layer,
   wherein the lower DBR layer and the lower spacer layer are disposed above the GaAs substrate and below the active region, and the lower DBR layer comprises a plurality of low refractive index layers and a plurality of high refractive index layers;
   wherein the upper DBR layer and the upper spacer layer are disposed above the active region, and the upper DBR layer comprises a plurality of low refractive index layers and a plurality of high refractive index layers;
   wherein the low refractive index layer of the upper DBR layer or the lower DBR layer contains $Al_{x1}Ga_{1-x1}As_{1-y1}P_{y1}$, and wherein at room temperature, a lattice constant of $Al_{x1}Ga_{1-x1}As_{1-y1}P_{y1}$ is greater than that of the GaAs substrate to lower the compressive strain of the lower DBR layer with respect to the GaAs substrate, wherein $0 < x1 \leq 1$ and $0 < y1 \leq 0.03$;
   wherein the high refractive index layer of the upper DBR layer or the lower DBR layer comprises GaAs, AlGaAs, or $Al_{x2}Ga_{1-x2}As_{1-y2}P_{y2}$, and a lattice constant of $Al_{x2}Ga_{1-x2}As_{1-y2}P_{y2}$ is greater than that of the GaAs substrate at room temperature to prevent the high refractive index layer of $Al_{x2}Ga_{1-x2}As_{1-y2}P_{y2}$ from generating a tensile strain at room temperature, wherein $0 < x2 \leq 1$ and $0 < y2 \leq 0.015$.

2. The VCSEL comprising the AlGaAsP layer with compressive strain as claimed in claim 1, wherein when the lower DBR layer is an N-type DBR layer, the upper DBR layer at least comprises a P-type DBR layer or at least comprises a P-type DBR layer and an N-type DBR layer.

3. The VCSEL comprising the AlGaAsP layer with compressive strain as claimed in claim 1, wherein when the lower DBR layer is a P-type DBR layer, the upper DBR layer at least comprises an N-type DBR layer or at least comprises an N-type DBR layer and a P-type DBR layer.

4. The VCSEL comprising the AlGaAsP layer with compressive strain as claimed in claim 1, wherein the plurality of low refractive index layers in the upper DBR layer or the lower DBR layer comprises $Al_{x1}Ga_{1-x1}As_{1-y1}P_{y1}$, and the plurality of high refractive index layers in the upper DBR layer or the lower DBR layer comprises $Al_{x2}Ga_{1-x2}As_{1-y2}P_{y2}$.

5. The VCSEL comprising the AlGaAsP layer with compressive strain as claimed in claim 1, wherein the plurality of low refractive index layer comprises $Al_{x1}Ga_{1-x1}As_{1-y1}P_{y1}$, wherein $0.7 \leq x1 \leq 1$.

6. The VCSEL comprising the AlGaAsP layer with compressive strain as claimed in claim 1, wherein the plurality of high refractive index layer comprises $Al_{x2}Ga_{1-x2}As_{1-y2}P_{y2}$, wherein $0 < x2 \leq 0.5$.

7. The VCSEL comprising the AlGaAsP layer with compressive strain as claimed in claim 1, wherein the plurality of low refractive index layer comprising $Al_{x1}Ga_{1-x1}As_{1-y1}P_{y1}$ and/or the plurality of high refractive index layer comprising $Al_{x2}Ga_{1-x2}As_{1-y2}P_{y2}$ include(s) a material uniform region, and a phosphorus composition in the material uniform region is approximately uniform.

8. The VCSEL comprising the AlGaAsP layer with compressive strain as claimed in claim 1, wherein the plurality of low refractive index layer comprising $Al_{x1}Ga_{1-x1}As_{1-y1}P_{y1}$ and/or the plurality of high refractive index layer comprising $Al_{x2}Ga_{1-x2}As_{1-y2}P_{y2}$ include(s) a material non-uniform region.

9. The VCSEL comprising the AlGaAsP layer with compressive strain as claimed in claim 8, wherein the material non-uniform region in the low refractive index layer further includes an aluminum-containing material different from the plurality of low refractive index layer of $Al_{x1}Ga_{1-x1}As_{1-y1}P_{y1}$.

10. The VCSEL comprising the AlGaAsP layer with compressive strain as claimed in claim 9, wherein the aluminum-containing material different from the plurality of low refractive index layer of $Al_{x1}Ga_{1-x1}As_{1-y1}P_{y1}$ is AlGaAs.

11. The VCSEL comprising the AlGaAsP layer with compressive strain as claimed in claim 8, wherein the material non-uniform region comprises a plurality of portions, and the phosphorus composition between at least two portions of the plurality of portions is different.

12. The VCSEL comprising the AlGaAsP layer with compressive strain as claimed in claim 9, wherein the material non-uniform region in the high refractive index layer further includes an aluminum-containing material different from the plurality of high refractive index layer of $Al_{x2}Ga_{1-x2}As_{1-y2}P_{y2}$.

13. The VCSEL comprising the AlGaAsP layer with compressive strain as claimed in claim 12, wherein the aluminum-containing material different from the plurality of high refractive index layer of $Al_{x2}Ga_{1-x2}As_{1-y2}P_{y2}$ is AlGaAs.

14. The VCSEL comprising the AlGaAsP layer with compressive strain as claimed in claim 1, further comprising an bandgap graded layer, wherein the bandgap graded layer is disposed between a pair of a low refractive index layer and a high refractive index layer, the bandgap graded layer comprises a plurality of bandgaps, the plurality of bandgaps of the bandgap graded layer will gradually increase or decrease, one of the plurality of bandgaps of the bandgap graded layer close to the high refractive index layer is relatively small, and one of the plurality of bandgaps of the bandgap graded layer close to the low refractive index layer is relatively large.

15. The VCSEL comprising the AlGaAsP layer with compressive strain as claimed in claim 14, wherein the bandgap graded layer comprises AlGaAs or $Al_{x3}Ga_{1-x3}As_{1-y3}P_{y3}$, wherein $0.1 \leq x3 \leq 0.9$.

16. The VCSEL comprising the AlGaAsP layer with compressive strain as claimed in claim 1, wherein the active region comprises a plurality of active layers.

17. The VCSEL comprising the AlGaAsP layer with compressive strain as claimed in claim 16, wherein the VCSEL further comprises an inner spacer layer, the inner spacer layer disposed between two active layers, the inner spacer layer comprises $Al_{x6}Ga_{1-x4}As_{1-y4}P_{y4}$, wherein $0<x4\leq 1$.

18. The VCSEL as claimed in claim 17, wherein a lattice constant of $Al_{x4}Ga_{1-x4}As_{1-y4}P_{y4}$ at room temperature is greater than that of the GaAs substrate.

19. The VCSEL comprising the AlGaAsP layer with compressive strain as claimed in claim 1, wherein the plurality of low refractive index layers in the upper DBR layer or the lower DBR layer comprises $Al_{x1}Ga_{1-x1}As_{1-y1}P_{y1}$, or the plurality of high refractive index layers in the upper DBR layer or the lower DBR layer comprises $Al_{x2}Ga_{1-x2}As_{1-y2}P_{y2}$.

* * * * *